United States Patent
Nakai (10) Patent No.: US 11,521,963 B2
(45) Date of Patent: Dec. 6, 2022

(54) SEMICONDUCTOR STORAGE DEVICE

(71) Applicant: KIOXIA CORPORATION, Tokyo (JP)

(72) Inventor: Takehiro Nakai, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 152 days.

(21) Appl. No.: 16/937,825

(22) Filed: Jul. 24, 2020

(65) Prior Publication Data

US 2021/0082908 A1 Mar. 18, 2021

(30) Foreign Application Priority Data

Sep. 12, 2019 (JP) .............................. JP2019-166229

(51) Int. Cl.
| | |
|---|---|
| *H01L 21/76* | (2006.01) |
| *H01L 27/02* | (2006.01) |
| *G11C 16/08* | (2006.01) |
| *G11C 16/04* | (2006.01) |
| *G11C 16/26* | (2006.01) |
| *H01L 27/115* | (2017.01) |

(52) U.S. Cl.
CPC ...... *H01L 27/0296* (2013.01); *H01L 27/0288* (2013.01); *G11C 16/0483* (2013.01); *G11C 16/08* (2013.01); *G11C 16/26* (2013.01); *H01L 27/115* (2013.01)

(58) Field of Classification Search
CPC ............. H01L 27/0296; H01L 27/0288; H01L 27/115; H01L 21/76224; H01L 21/761; H01L 23/585; H01L 27/105; G11C 16/0483; G11C 16/08; G11C 16/26
See application file for complete search history.

(56) References Cited

U.S. PATENT DOCUMENTS

| | | |
|---|---|---|
| 5,739,575 A | 4/1998 | Numano et al. |
| 6,885,080 B2 | 4/2005 | Chen et al. |
| 6,949,775 B1 | 9/2005 | Takada |
| 8,241,999 B2 | 8/2012 | Ikeda et al. |
| 9,704,909 B2 | 7/2017 | Kaneda |
| 2006/0035447 A1 | 2/2006 | Ikeda et al. |
| 2008/0237784 A1 | 10/2008 | Miyamoto et al. |

(Continued)

FOREIGN PATENT DOCUMENTS

| | | |
|---|---|---|
| JP | H07-297174 A | 11/1995 |
| JP | H09-069609 A | 3/1997 |

(Continued)

*Primary Examiner* — Samuel Park
(74) *Attorney, Agent, or Firm* — Foley & Lardner LLP (57) ABSTRACT

A semiconductor storage device includes a circuit region formed on a semiconductor substrate, and a guard ring region spaced from one side of the circuit region by a predetermined distance. The guard ring region extends in a first direction, the first direction being a direction in which the one side of the circuit region extends, includes a guard ring line, an element isolation region, a first defect trapping layer, a second defect trapping layer. The first defect trapping layer extends from a boundary location between the circuit region and the element isolation region to a location spaced from a boundary location between the element isolation region and the guard ring line by an offset distance toward the element isolation region in the second direction.

11 Claims, 8 Drawing Sheets

(56) References Cited

U.S. PATENT DOCUMENTS

| | | | |
|---|---|---|---|
| 2011/0220996 A1* | 9/2011 | Kutsukake | H01L 27/11546 |
| | | | 257/E21.546 |
| 2012/0083066 A1* | 4/2012 | Kim | H01L 27/14643 |
| | | | 438/73 |
| 2017/0040335 A1* | 2/2017 | Lim | H01L 27/11582 |
| 2020/0020734 A1* | 1/2020 | Wang | H01L 27/14625 |
| 2021/0082908 A1 | 3/2021 | Nakai | |

FOREIGN PATENT DOCUMENTS

| | | | |
|---|---|---|---|
| JP | H969609 A | 3/1997 | |
| JP | H10-022262 A | 1/1998 | |
| JP | 2001-332559 A | 11/2001 | |
| JP | 2006-080481 A | 3/2006 | |
| JP | 2006-303073 A | 11/2006 | |
| JP | 2008-258265 A | 10/2008 | |
| JP | 2009-224585 A | 10/2009 | |
| JP | 2021-044433 A | 3/2021 | |

* cited by examiner

SEMICONDUCTOR STORAGE DEVICE

CROSS-REFERENCE TO RELATED APPLICATION(S)

This application is based upon and claims the benefit of priority from Japanese Patent Application No. 2019-166229, filed Sep. 12, 2019, the entire contents of which are incorporated herein by reference.

FIELD

Embodiments described herein relate generally to a semiconductor storage device.

BACKGROUND

A semiconductor storage device having a structure in which the periphery of an element formation region is surrounded by a guard ring has been known.

DETAILED DESCRIPTION

Embodiments provide a semiconductor storage device capable of preventing crystal defects occurring from a guard ring as a starting point from extending to an element formation region.

In general, according to one embodiment, a semiconductor storage device includes: a circuit region formed on a semiconductor substrate; and a guard ring region spaced from one side of the circuit region by a predetermined distance. The guard ring region extends in a first direction, the first direction being a direction in which the one side of the circuit region extends, includes a guard ring line. The guard ring line includes a plurality of guard ring patterns over a surface of the semiconductor substrate, each of the plurality of guard ring patterns include a first line segment extending in the first direction, a second line segment extending from a first end of the first line segment in a second direction orthogonal to the first direction, and a third line segment extending from a second end of the first line segment in the second direction. In a first one and a second one of the plurality of guard ring patterns adjacent to each other, the second line segment of the first guard ring pattern is connected to the third line segment of the second guard ring pattern by a fourth line segment extending in the second direction. The guard ring region includes an element isolation region, formed between the circuit region and the guard ring line, that extends into the semiconductor substrate to a first depth. The guard ring region includes a first defect trapping layer, which is a distorted layer, formed below the element isolation region. The guard ring region includes a second defect trapping layer, which is a distorted layer, formed along a boundary between the element isolation region and the circuit region, the second defect trapping layer extending into the semiconductor substrate to a second depth equal to the first depth. The first defect trapping layer extends from a boundary location between the circuit region and the element isolation region to a location spaced from a boundary location between the element isolation region and the guard ring line by an offset distance toward the element isolation region in the second direction.

Hereinafter, embodiments will be described with reference to the drawings.

Figure 1A:
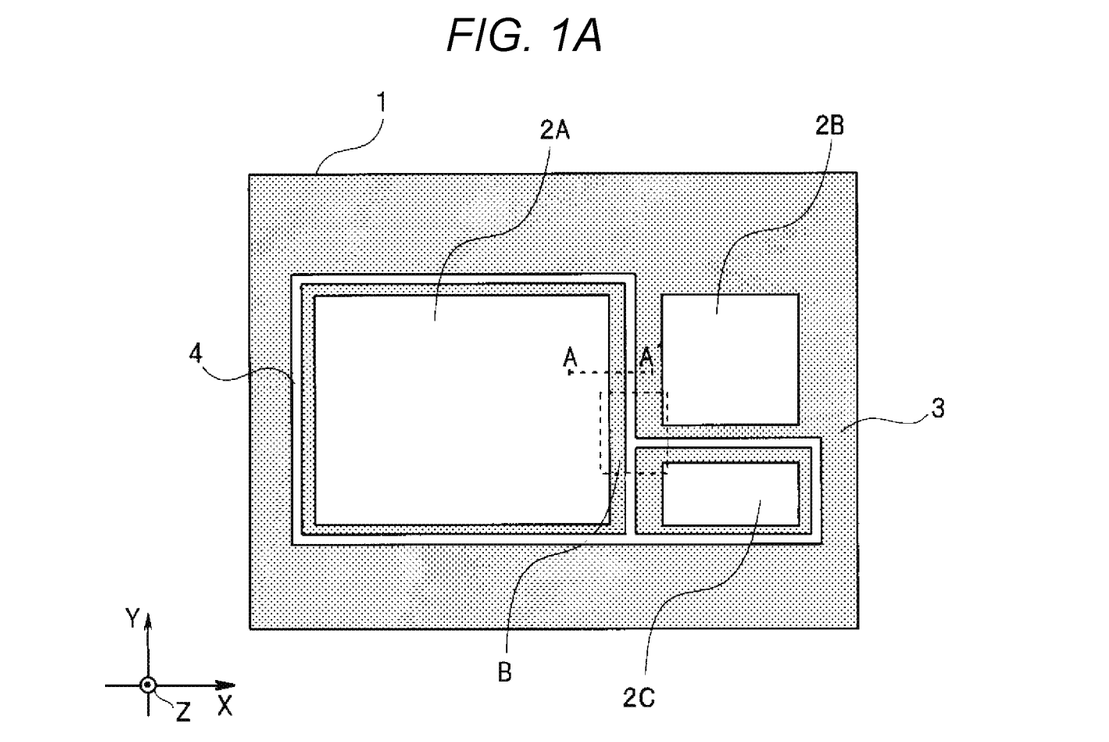
FIG. 1A is a plan view illustrating a configuration example of a semiconductor storage device according to an embodiment of the present disclosure.
Figure 1B:
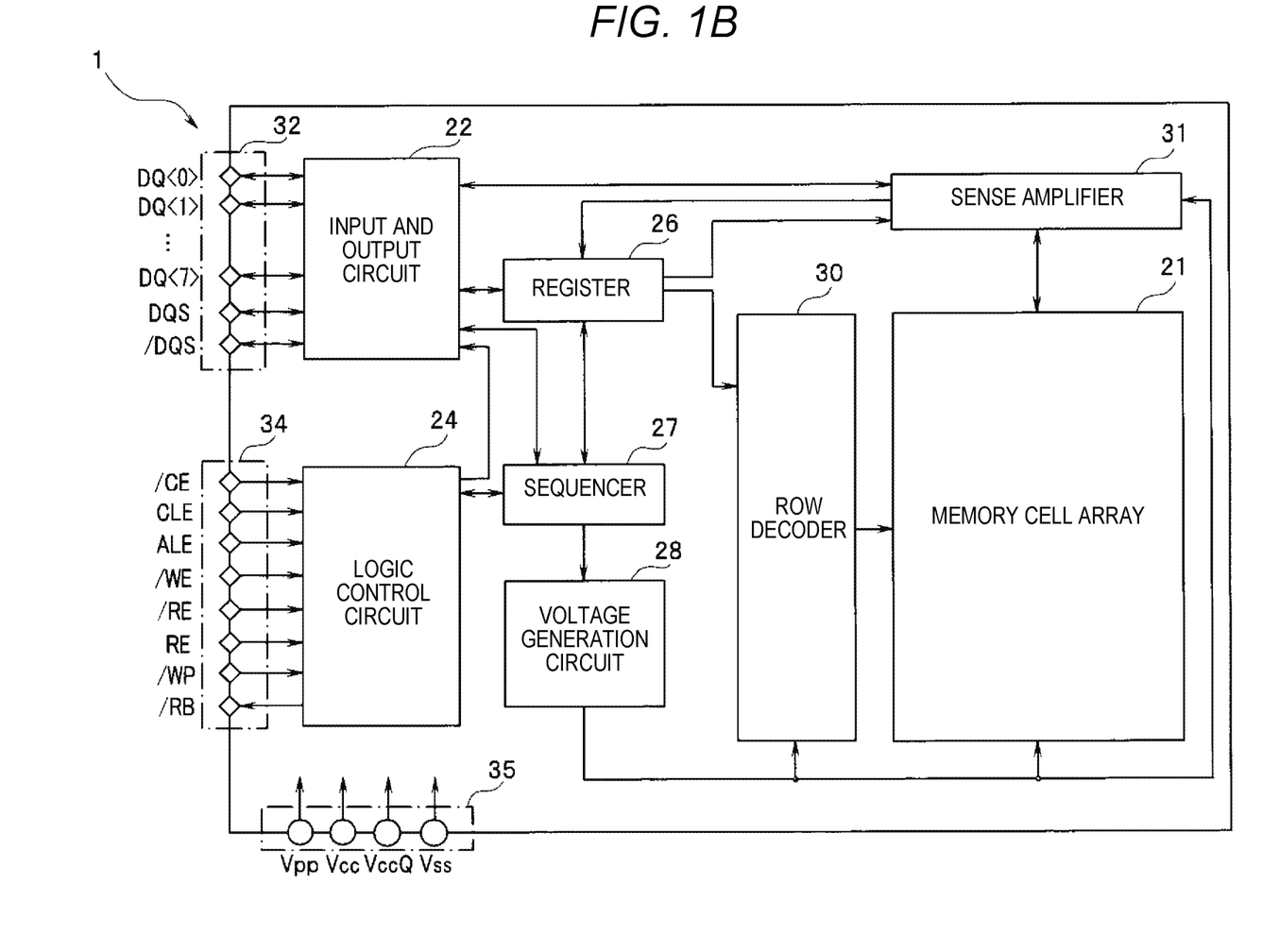
FIG. 1B is a block diagram illustrating the configuration example of the semiconductor storage device according to the embodiment of the present disclosure.
Figure 2:
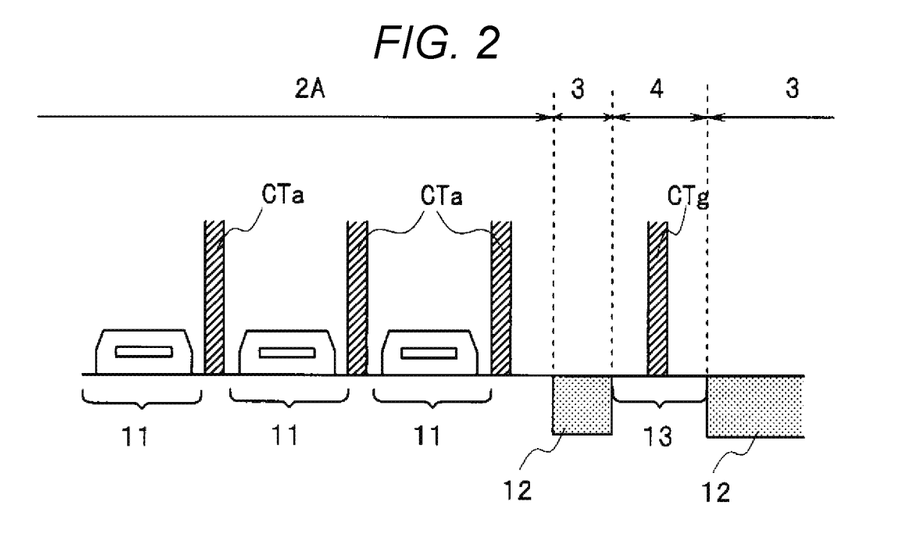
FIG. 2 is a cross-sectional view illustrating the configuration example of the semiconductor storage device according to the embodiment of the present disclosure.

FIG. 1A is a plan view illustrating a configuration example of a semiconductor storage device according to an embodiment of the present disclosure. FIG. 1B is a block diagram illustrating the configuration example of the semiconductor storage device according to the embodiment of the present disclosure. FIG. 2 is a cross-sectional view illustrating the configuration example of the semiconductor storage device according to the embodiment of the present disclosure, and is a cross-sectional view taken along the line A-A' of the semiconductor storage device illustrated in FIG. 1A. FIG. 1A is a plan view of apart of a semiconductor storage device 1 including a guard ring region 4 which is a feature of the present disclosure. The semiconductor storage device 1 according to the embodiment is, for example, a nonvolatile memory including a NAND memory (a NAND flash memory), and is formed as a semiconductor chip. A surface of a semiconductor substrate 10 of the semiconductor storage device 1 is parallel to an XY plane extending in an X direction and a Y direction. The semiconductor storage device 1 has a rectangular shape having an end side along the X direction and the Y direction when viewed from a Z direction perpendicular to the XY plane. The X direction, the Y direction, and the Z direction are orthogonal to each other.

As illustrated in FIG. 1A, in the semiconductor storage device 1, a first circuit region 2A, a second circuit region 2B, and a third circuit region 2C are formed. Each of the first circuit region 2A, the second circuit region 2B, and the third circuit region 2C functions as, for example, an element formation region. A guard ring region 4 surrounds the first circuit region 2A and the third circuit region 2C. In the first circuit region 2A and the second circuit region 2B, a peripheral circuit forming the semiconductor storage device 1 is formed in a functional block unit.

As illustrated in FIG. 1B, the semiconductor storage device 1 according to the embodiment includes, for example, a memory cell array 21, an input and output circuit 22, a logic control circuit 24, a register 26, a sequencer 27, a voltage generation circuit 28, a row decoder 30, a sense amplifier 31, an input and output pad group 32, a logic control pad group 34, and a power supply input terminal group 35.

The memory cell array 21 includes a plurality of nonvolatile memory cells (not illustrated) associated with a word line and a bit line.

The input and output circuit 22 transmits and receives a signal DQ <7:0> and data strobe signals DQS and /DQS to and from a memory controller 1. The input and output circuit 22 transfers a command and an address in the signal DQ <7:0> to the register 26. The input and output circuit 22 transmits and receives write data and read data to and from the sense amplifier 31.

The logic control circuit 24 receives a chip enable signal /CE, a command latch enable signal CLE, an address latch enable signal ALE, a write enable signal /WE, a read enable signals RE and /RE, and a write protect signal /WP from the memory controller 1. The logic control circuit 24 transfers a ready busy signal /RB to the memory controller 1, thereby notifying the outside of a state of a nonvolatile memory 2.

The voltage generation circuit 28 generates a voltage required for operations such as writing, reading, and erasing of the data based upon an instruction from the sequencer 27.

The row decoder 30 receives a block address and a row address in the address from the register 26, selects a corresponding block based upon the block address, and selects a corresponding word line based upon the row address.

At the time of reading the data, the sense amplifier 31 senses the read data that are read from the memory cell to the bit line, and transfers the sensed read data to the input and output circuit 22. At the time of writing the data, the sense amplifier 31 transfers the write data to be written to the memory cell via the bit line.

In order to transmit and receive each signal including the data to and from the memory controller 1, the input and output pad group 32 includes a plurality of terminals (pads) corresponding to the signal DQ <7:0> and the data strobe signals DQS and /DQS.

In order to transmit and receive each signal to and from the memory controller 1, the logic control pad group 34 includes a plurality of terminals (pads) corresponding the chip enable signal /CE, the command latch enable signal CLE, the address latch enable signal ALE, the write enable signal /WE, the read enable signals RE and /RE, and the write protect signal /WP.

The power supply input terminal group 35 includes a plurality of terminals for inputting power supply voltages Vcc, VccQ, Vpp and a ground voltage Vss in order to supply various operation powers to the nonvolatile memory 2 from the outside. The power supply voltage Vcc is a circuit power supply voltage generally applied from the outside as an operation power supply, and for example, a voltage of about 3.3 V is inputted. In the case of the power supply voltage VccQ, for example, a voltage of 1.2 V is inputted. The power supply voltage VccQ is used when transmitting and receiving a signal between the memory controller 1 and the nonvolatile memory 2. The power supply voltage Vpp is a power supply voltage higher than the power supply voltage Vcc, and for example, a voltage of 12 V is inputted. When the data are written to the memory cell array 21 or the data are erased therein, a high voltage of about 20 V is required. At this time, boosting the power supply voltage Vpp of about 12 V can generate a desired voltage with a high speed and low power consumption, rather than boosting the power supply voltage Vcc of about 3.3 V with a boosting circuit of the voltage generation circuit 28. On the other hand, for example, when the nonvolatile memory 2 is used in an environment where a high voltage cannot be supplied, a voltage may not be supplied to the power supply voltage Vpp. Even when the power supply voltage Vpp is not supplied, the nonvolatile memory 2 can execute various operations as long as the power supply voltage Vcc is supplied. That is, the power supply voltage Vcc is a power supply that is supplied to the nonvolatile memory 2 as a standard, and the power supply voltage Vpp is a power supply that is additionally supplied or freely selected to be supplied according to, for example, a use environment.

FIG. 1B schematically illustrates portions corresponding to the first circuit region 2A, the second circuit region 2B, and the third circuit region 3C among the plurality of circuit regions in the semiconductor storage device 1. For example, a circuit forming the sense amplifier 31 is formed in the first circuit region 2A, a circuit forming the sequencer 27 is formed in the second circuit region 2B, and a circuit forming a cache is formed in the third circuit region 2C. As another example formed in the first circuit region 2A, the second circuit region 2B, and the third circuit region 2C in a functional block unit, the row decoder 30, the register 26, the voltage generation circuit 28, and the logic control circuit 24 are described. The first circuit region 2A or the second circuit region 2B may be the memory cell array 21.

The guard ring region 4 cuts off electrical connection between the adjacent circuit regions (for example, the second circuit region 2B and the third circuit region 2C) and the first circuit region 2A, and prevents electrical interference with respect to a circuit formed in the first circuit region 2A from an external circuit. The guard ring region 4 cuts off electrical connection between the adjacent circuit regions (for example, the first circuit region 2A and the second circuit region 2B) and the third circuit region 2C, and prevents electrical interference with respect to a circuit formed in the third circuit region 2C from an external circuit. In the semiconductor storage device 1 according to the embodiment, the guard ring region 4 is formed in a circuit isolation region 3 so as to continuously surround the periphery of the first circuit region 2A on the XY plane. The guard ring region 4 is formed in the circuit isolation region 3 so as to continuously surround the periphery of the third circuit region 2C on the XY plane. That is, on the XY plane, when one side in the X direction is defined as "right", the other side in the X direction is defined as "left", one side in the Y direction is defined as "upper", and the other side in the Y direction is defined as "lower", respectively, the guard ring region 4 is formed at a place corresponding to the right, left, upper and lower sides of the first circuit region 2A and the third circuit region 2C in the circuit isolation region 3.

The guard ring region 4 may not have a configuration that surrounds the first circuit region 2A and the third circuit region 2C. For example, a U-shaped guard ring region 4, in which among the sides extending in the Y direction in the first circuit region 2A, a portion extending in the Y direction is omitted on the left side of a side far from the second circuit region 2B and the third circuit region 2C, may be used. That is, an arrangement place and a planar shape of the guard ring region 4 are designed in consideration of a relative locational relationship and an electrical characteristic (for example, an allowable noise level) between a circuit region in which the electrical interference with the external circuit is desired to be prevented (for example, the first circuit region 2A), and other adjacent circuit regions (for example, the second circuit region 2B and the third circuit region 2C).

As illustrated in FIG. 2, the guard ring region 4 is formed via the circuit isolation region 3 on the right side of the first circuit region 2A in the X direction on the semiconductor substrate 10. The circuit isolation region 3 is also formed on the right side of the guard ring region 4 in the X direction.

That is, the guard ring region 4 has a structure of being interposed between the circuit isolation regions 3.

A plurality of transistors 11 are formed in the first circuit region 2A. A predetermined potential is supplied to the source and drain of the transistor 11 from an upper wiring layer (not illustrated) via a contact electrode CTa.

In the circuit isolation region 3, for example, shallow trench isolation (STI) is formed as an element isolation region 12. The STI has a configuration in which a silicon oxide film as an insulator is embedded in a groove part having a predetermined depth formed in the semiconductor substrate 10.

A guard ring line 13 is disposed in the guard ring region 4. A predetermined potential is supplied to the guard ring line 13 from an upper wiring layer (not illustrated) via a contact electrode CTg. The potential supplied to the guard ring line 13 from the upper wiring layer via the contact electrode CTg is supplied to the semiconductor substrate 10 of the first circuit region 2A via the semiconductor substrate 10. That is, the guard ring region 4 can stabilize a well potential at which the transistor 11 is formed in the first circuit region 2A, thereby making it possible not only to prevent noise from the external circuit from being mixed, but also to prevent the well potential from becoming unstable.

Figure 3A:
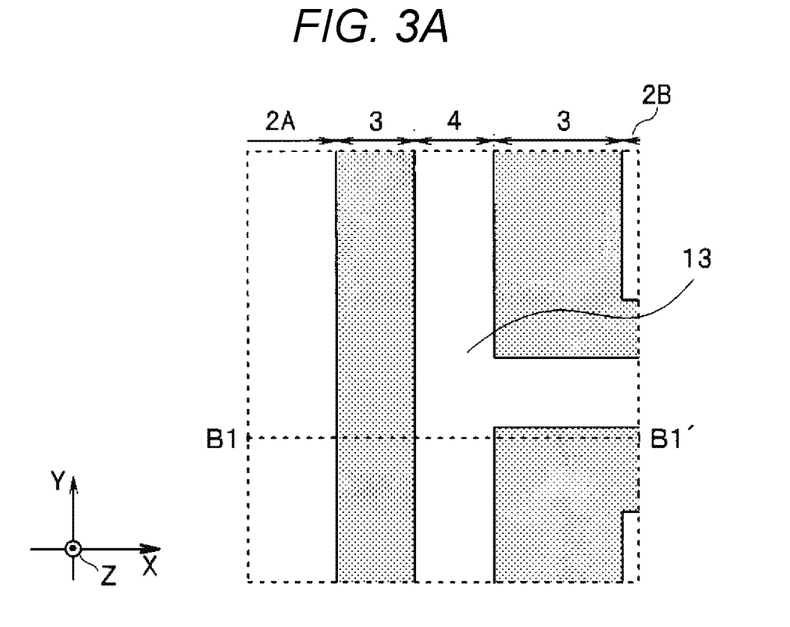
FIG. 3A is a plan view illustrating a comparative layout of a guard ring line disposed in a guard ring region.

FIG. 3A is a plan view illustrating a layout of a comparative example of the guard ring line 13 disposed in the guard ring region 4. FIG. 3A is a plan view obtained by cutting a rectangular region B surrounded by a dotted line in FIG. 1A. In the comparative example illustrated in FIG. 3A, all regions of the guard ring region 4 are formed of the guard ring line 13. Here, crystal defects occurring near a boundary between the semiconductor substrate 10 below the guard ring line 13 and the element isolation region 12 will be described with reference to the comparison example illustrated in FIG. 3A.

Figure 3B:
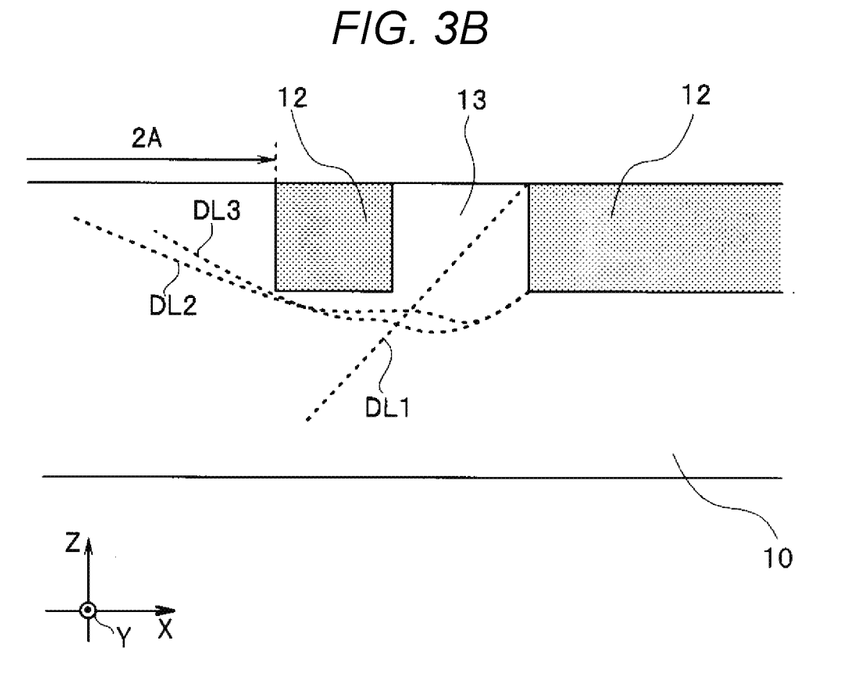
FIG. 3B is a cross-sectional view illustrating a dislocation line extending to a semiconductor substrate.

FIG. 3B is a cross-sectional view illustrating a dislocation line extending to the semiconductor substrate. FIG. 3B is a cross-sectional view taken along the line B1-B1' of the comparative example illustrated in FIG. 3A. The element isolation region 12 is formed of silicon oxide, and the guard ring line 13 is formed of silicon. The silicon oxide film and silicon have different thermal expansion coefficients. Therefore, in the process of forming various semiconductor circuits on the semiconductor substrate 10, when a heat treatment process applied to the semiconductor substrate (a film formation process using a thermal reaction at a high temperature, such as thermal oxide film formation and thermal oxynitride film formation, and an annealing processing process for thermally diffusing an impurity which is performed after doping the impurity in the semiconductor substrate by ion implantation) is executed, the silicon oxide forming the element isolation region 12 contracts, thereby extending the silicon forming the guard ring line 13.

When tensile stress is applied to the surrounding silicon by the silicon oxide, distortion is generated in the guard ring line 13. When the distortion becomes large, the crystal defects occur at a place where the distortion is generated. The silicon crystal forming the semiconductor substrate 10 includes a "slip surface" of a {111} surface generating deformation depending on its crystal structure. Dislocations DL1, DL2, and DL3 extend along the slip surface of the silicon with the generated crystal defects as a starting point.

Figure 3C:
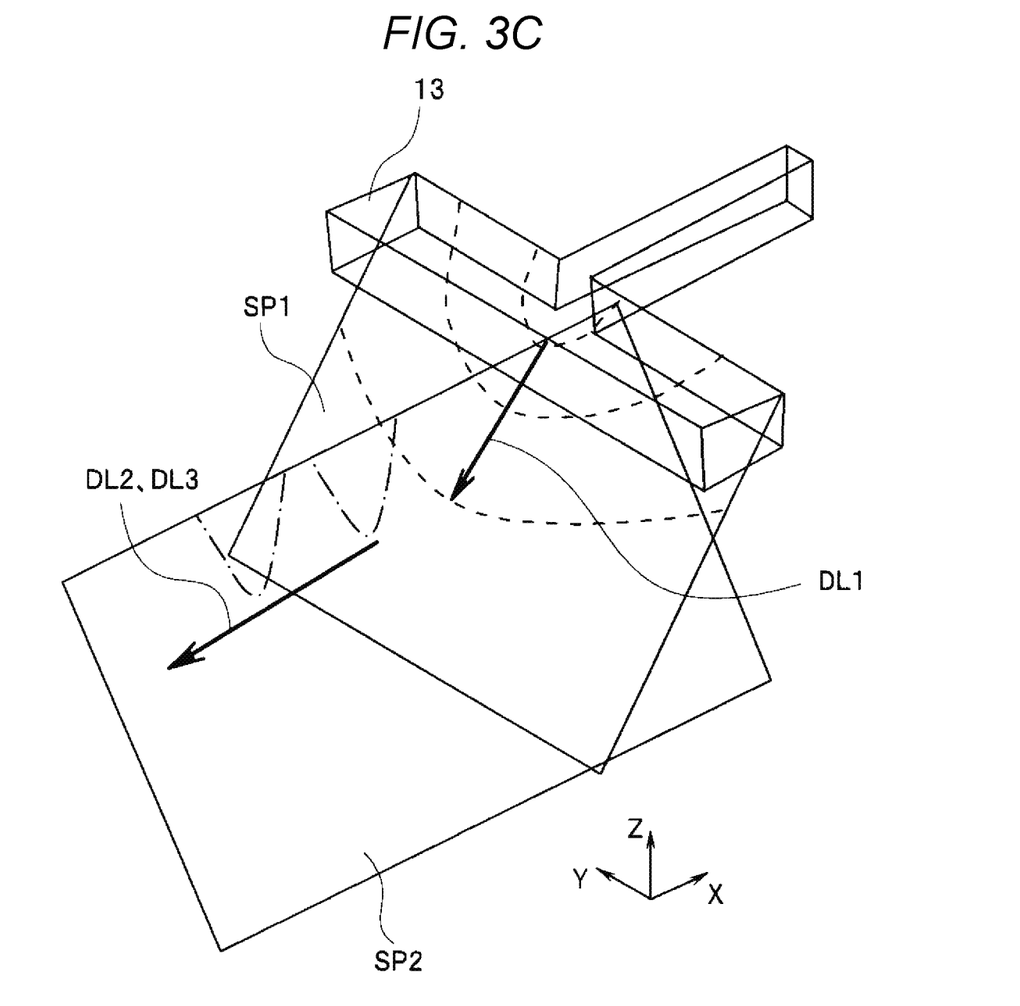
FIG. 3C is a perspective view illustrating an extension direction of the dislocation line in the semiconductor substrate.

FIG. 3C is a perspective view illustrating an extension direction of a dislocation line in the semiconductor substrate. Silicon forming the semiconductor substrate is a face-centered cubic lattice, and the slip surface is the {111} surface. That is, four equivalent slip surfaces exist in the crystal. As illustrated in FIG. 3C, the dislocation DL1 starts from crystal defects occurring near a boundary between the element isolation region 12 and the guard ring line 13 on the surface of the semiconductor substrate, and extends along a slip surface SP1 (a plane parallel to the Y axis and having an angle of 54.7 degrees with respect to the X axis and the Z axis). The dislocations DL2 and DL3 start from crystal defects occurring near a boundary between a bottom corner of the element isolation region 12 and the guard ring line 13, and extend along a slip surface SP2 (a plane parallel to the X axis and has an angle of 54.7 degrees with respect to the Y axis and the Z axis). The dislocation DL may not only extend along one slip surface, but also extend up to a further distant place by changing over from one slip surface to a plurality of slip surfaces.

For example, when the dislocation DL extends up to the first circuit region 2A through the semiconductor substrate 10 of a lower layer of the element isolation region 12 as in the dislocations DL2 and DL3, for example, the dislocation DL2 becomes a current leak source of the transistor 11 formed in the first circuit region 2A, and there is a risk of causing a device failure. Therefore, in order to improve the reliability of the semiconductor storage device, it is required to prevent the dislocation DL from extending up to the first circuit region 2A.

To prevent the extension of the dislocation DL, a method is described of inhibiting the extension thereof before the dislocation DL reaches the first circuit region 2A. For example, a highly distorted region into which a high-concentration impurity is implanted is formed in the semiconductor substrate 10 of the lower layer of the element isolation region 12. The dislocation DL may be prevented from reaching the first circuit region 2A by guiding the dislocation DL to the highly distorted region. However, the extension distance of the dislocation DL is considered to be proportional to the magnitude of the stress at the starting point, and when a large stress is applied to the starting point, the extension of the dislocation DL spreads not only in the downward direction (in the Z direction) but also in the horizontal direction (in the X direction and Y direction) while changing over to the slip surface of silicon. Therefore, it is difficult to guide and confine the dislocation DL to the highly distorted region provided in the lower layer of the element isolation region 12.

As another method of preventing the extension of the dislocation DL, a method of described of relaxing the distortion generated in the guard ring line 13 and reducing the stress applied to a generation starting point of the dislocation DL. Therefore, the semiconductor storage device 1 according to the embodiment generates the crystal defects while the distortion is small, thereby extending the dislocation DL. Accordingly, the distortion is relaxed before the large distortion is accumulated in a wafer processing process thereafter, and the dislocation DL is prevented from extending up to the distant place.

The crystal defects selectively occurs at a place where the large distortion is locally generated. Therefore, when a place to which stress larger than the periphery is applied (a stress concentration point) is intentionally generated, the crystal defects can occur at that place. The magnitude of the stress depends on a pattern shape of the guard ring line 13. That is, when a width of the guard ring line 13 and a width of the element isolation region 12 in the X direction are compared with each other, the smaller a ratio of a width (L) of the guard ring line 13 to a width (S) of the element isolation region 12 (an L/S line width ratio) is, the larger the stress to be generated is. As the volume of the element isolation region 12 adjacent to the guard ring line 13 is large, the stress to be generated becomes large.

When the guard ring line 13 is viewed on the XY plane, forming the element isolation region 12 adjacent to the Y direction in addition to forming the element isolation region 12 adjacent to the X direction allows the stress applied to the guard ring line 13 to become large. That is, the larger stress is applied to the guard ring line 13 provided with a branch line extending in the X direction in the middle of a straight line extending in the Y direction, and to the guard ring line 13 extending in the X direction via a hook-shaped part bent at a right angle on the XY plane after extending in the Y direction by a predetermined distance by the presence of the stress concentration point, rather than the linear guard ring line 13 extending in the Y direction. More specifically, in the case of the guard ring line 13 provided with the branch line extending in the X direction in the middle of the straight line extending in the Y direction, the largest stress is applied to the intersection of the straight line extending in the Y direction and the branch line, and in the case of the guard ring line 13 that is bent at a right angle on the XY plane and extends in the X direction, the largest stress is applied to a place that is bent from the Y direction to the X direction (a bent part).

Therefore, a line width of the guard ring line 13 is made thin, and the bent part and the branch line are provided in the middle of the guard ring line 13, thereby making it possible to intentionally provide the stress concentration point.

Considering the above-described conditions where the stress concentration point is likely to occur, in the semiconductor storage device 1 according to the embodiment, the meander-shaped guard ring line 13 having a large number of bent parts is used. That is, the stress concentration point is positively disposed on the guard ring line 13, and the crystal defects occur at the stress concentration point while the distortion is small, thereby allowing the dislocation DL to occur. Since the extension distance of the dislocation DL occurring from the small distortion becomes short, the dislocation DL can be prevented from extending toward a center part of the circuit. As a result, the distortion generated in the guard ring line 13 is relaxed, and the dislocation DL is prevented from extending up to the first circuit region 2A.

Figure 4:
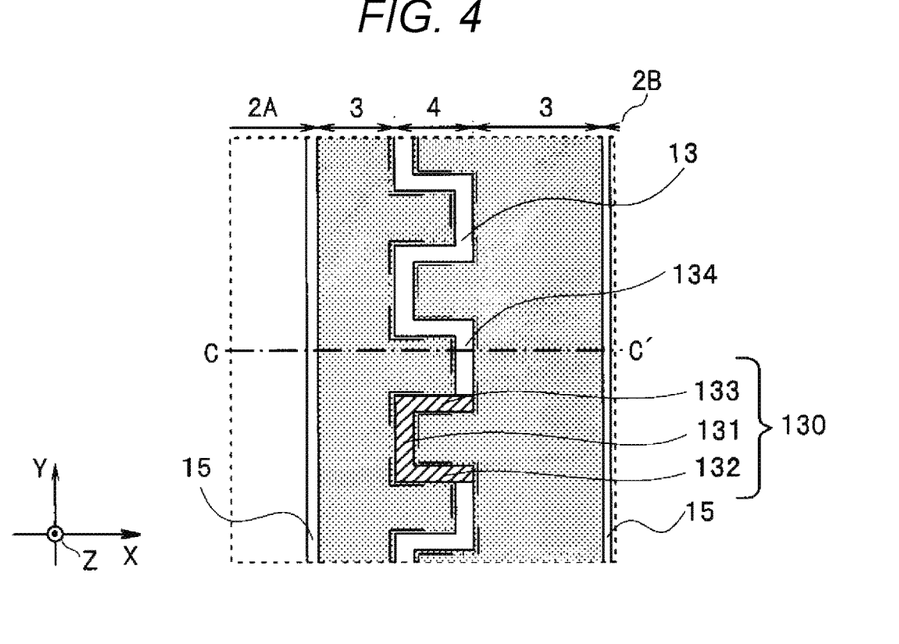
FIG. 4 is a plan view illustrating a layout of the guard ring line disposed in the guard ring region.

FIG. 4 is a plan view illustrating a layout of the guard ring line 13 disposed in the guard ring region 4. FIG. 4 illustrates the guard ring region 4 between the first circuit region 2A and the second circuit region 2B. As illustrated in FIG. 4, the guard ring line 13 in the embodiment is formed so that a width of the guard ring line 13 in the X direction is narrower than a width of the guard ring region 4 in the X direction. The guard ring line 13 extends in the Y direction (a positive direction) by a predetermined length, after which the guard ring line 13 is bent at a right angle and extends in the X direction (a positive direction). After extending in the X direction (the positive direction) by a predetermined length, the guard ring line 13 is bent at a right angle and extends in the Y direction (the positive direction). Next, after extending in the Y direction (the positive direction) by a predetermined length, the guard ring line 13 is bent at a right angle and extends in the X direction (a negative direction). The guard ring line 13 is formed by continuously and repeatedly arranging such wiring patterns in the Y direction (the positive direction)→in the X direction (the positive direction) →in the Y direction (the positive direction)→in the X direction (the negative direction).

In other words, the guard ring line 13 arranges a plurality of guard ring patterns 130 including a first wiring 131 extending in the Y direction by the predetermined length, a second wiring 132 extending in the X direction by the predetermined length from one end of the first wiring 131, and a third wiring 133 extending in the X direction by the predetermined length from the other end of the first wiring 131 side by side in the Y direction, and the adjacent guard ring pattern 130 is formed by connecting the second wiring 132 of one guard ring pattern 130 and the third wiring 133 of the other guard ring pattern 130 by a fourth wiring 134 extending in the Y direction by a predetermined length. In FIG. 4, a portion of the guard ring line 13 indicated by oblique lines is one guard ring pattern 130.

In the guard ring region 4, the element isolation region 12 is formed in a region other than a region where the guard ring line 13 is formed. The element isolation region 12 formed in the guard ring region 4 is formed continuously with the element isolation region 12 formed in the circuit isolation region 3. That is, when the element isolation region 12 is formed in the semiconductor substrate 10, a groove for the element isolation region 12 formed in the circuit isolation region 3 and a groove for the element isolation region 12 formed in the guard ring region 4 are collectively formed. Accordingly, the silicon oxide film is embedded in the formed groove part, thereby forming the element isolation region 12 that performs electrical isolation between the first circuit region 2A and the guard ring line 13.

By forming the guard ring line 13 in this manner, a large number of bent parts, which are portions bent at right angles from the Y direction to the X direction or from the X direction to the Y direction, are formed in the guard ring line 13. The width of the guard ring line 13 in the X direction is narrower than the width of the guard ring line 13 of the comparative example illustrated in FIG. 3A, and the volume of the element isolation region 12 formed between the first circuit region 2A and the guard ring line 13 is large, whereby the stress applied to the guard ring line 13 becomes high. Therefore, while the distortion is small, the stress is intensively applied to the bent part, such that the crystal defects are induced and the dislocation DL occurs. Accordingly, the distortion can be relaxed before the large distortion is accumulated, and the dislocation DL can be prevented from extending up to the distant place.

Figure 5:
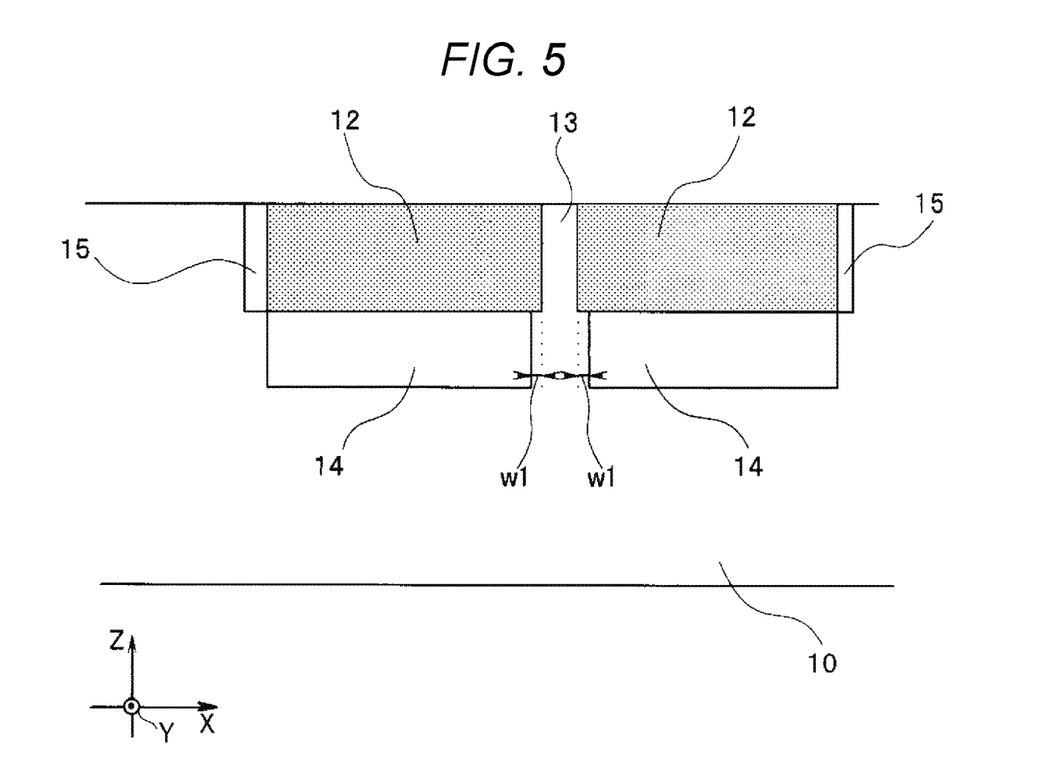
FIG. 5 is a cross-sectional view taken along the line C-C' in FIG. 4.

FIG. 5 is a diagram illustrating a cross-sectional structure of the semiconductor storage device 1 according to the embodiment. FIG. 5 is a cross-sectional view taken along the direction (=X direction) orthogonal to the extending direction of the guard ring region 4 on the XY plane, and more specifically, illustrates a cross-sectional view taken along the line C-C' in FIG. 4. As illustrated in FIG. 5, the semiconductor storage device 1 according to the embodiment includes a defect trapping region 14 provided on the semiconductor substrate 10 below the element isolation region 12. The defect trapping region 14 as a first defect trapping layer is a highly distorted region for inducing the dislocation DL, and for example, is formed by performing the ion implantation of an element having an effect of capturing the crystal defects (for example, carbon, oxygen, and boron) into the semiconductor substrate 10. Alternatively, the defect trapping region 14 is formed by performing film formation with a material having a different crystal structure from that of silicon forming the semiconductor substrate 10 (for example, polycrystalline silicon, silicon oxide, silicon nitride, and silicon carbide).

As illustrated in FIG. 5, an end part on the side of the guard ring line 13 of the defect trapping region 14 in the X direction is formed at a location offset to the side of the element isolation region 12 by a predetermined distance w1 from a boundary part between the element isolation region 12 and the guard ring line 13. When the XY plane is viewed from above in the Z direction as illustrated in FIG. 4, the defect trapping region 14 is formed below the element isolation region 12 indicated by half-tone dot meshing, and is formed between a line connecting a location separated from the guard ring line 13 by a fixed distance (an alternated long and short dash line in FIG. 4) and a boundary between the element isolation region 12 and the first circuit region 2A, and between the line connecting the location separated from the guard ring line 13 by the fixed distance and a boundary between the element isolation region 12 and the second circuit region 2B.

The defect trapping region 14 is disposed as described above due to the following reasons. That is, an upper corner part and a bottom corner part of the element isolation region 12 are parts where the stress is concentrated and places where the crystal defects easily occur. However, when the defect trapping region 14 is disposed adjacent to the bottom corner part of the element isolation region 12, occurrence of the crystal defects from the bottom corner part can be prevented. If the crystal defects occur as a result of largely-accumulated distortion, the dislocation DL may extend long. In order to prevent the occurrence of such long dislocation DL, the distortion is relaxed by allowing (inducing) the occurrence of the crystal defects before the distortion is largely accumulated and is still small. Therefore, the defect trapping region 14 is disposed separately by the predetermined distance w1 from the bottom corner part of the element isolation region 12 which is the stress concentration part, thereby allowing (inducing) the occurrence of the substantially-harmless crystal defects. It is desirable that a distance from the boundary between the element isolation region 12 and the guard ring line 13 to the defect trapping region 14 is equal to or greater than the width of the guard ring line 13.

Since the dislocation DL starting from the crystal defects occurring near the stress concentration point at the bottom corner part of the element isolation region 12 can be guided to the defect trapping region 14 near the starting point by arranging the defect trapping region 14 in this manner, an effect of preventing the dislocation DL from extending below the element isolation region 12 and from reaching the first circuit region 2A can be obtained.

In the semiconductor storage device 1 according to the embodiment, a defect trapping region 15 having the same depth as that of the element isolation region 12 can also be provided at the boundary between the element isolation region 12 and at least one of the first circuit region 2A or the second circuit region 2B. The defect trapping region 15 as a second defect trapping layer is a highly distorted region for guiding the dislocation DL. The defect trapping region 15 captures the dislocations DL that cannot be captured by the defect trapping region 14. That is, the dislocation DL extending in the lower layer of the element isolation region 12 is prevented from further extending in the horizontal direction with respect to the XY plane and from reaching the first circuit region 2A. In the same manner as that of the defect trapping region 14, the defect trapping region 15 is formed by performing the ion implantation of the element having the effect of capturing the crystal defects into the semiconductor substrate 10 or by performing the film formation with the material having the different crystal structure from that of silicon forming the semiconductor substrate 10.

When the defect trapping region 15 is formed by implanting boron, the defect trapping region 15 becomes a p-type region. In this case, it is desirable to further provide a boron countermeasure structure such as changing the defect trapping region 15 to an island-shaped layout or providing the element isolation region between the defect trapping region 15 and the first circuit region 2A, so that boron implanted into the defect trapping region 15 does not affect an electrical characteristic of the first circuit region 2A, and the defect trapping region 15 is not disposed near the transistor 11 formed in the first circuit region 2A.

As described above, according to the embodiment, the shape of the guard ring line 13 is a meander shape having a large number of bent parts. Accordingly, the bent part formed in the guard ring line 13 becomes the stress concentration point, and the stress is intensively applied to the bent part while the distortion is small, whereby the crystal defects are induced and the dislocation DL occurs. Thus, the distortion can be relaxed before the large distortion is accumulated, and the dislocation DL can be prevented from extending up to the distant place.

According to the embodiment, the defect trapping region 14 is provided in the lower layer of the element isolation region 12 from the location offset in the direction of the element isolation region 12 by the predetermined distance from the boundary between the guard ring line 13 and the element isolation region 12 to the boundary between the element isolation region 12 and the first circuit regions 2A and 2B. That is, since the defect trapping region 14 is provided so as not to be close to the bottom corner part of the element isolation region 12, it is possible to capture the dislocation DL extending below the element isolation region 12 with the crystal defects occurring at the bent part of the guard ring line 13 as a starting point, by allowing (inducing) occurrence of the crystal defects at the bent part thereof.

According to the embodiment, the defect trapping region 15 is provided at the boundary between the element isolation region 12 and the first circuit region 2A and at the boundary between the element isolation region 12 and the second circuit region 2B. Accordingly, it is possible to prevent the dislocation DL that cannot be captured by the defect trapping region 14 from extending to the first circuit region 2A and the second circuit region 2B. As described above, according to the embodiment, it is possible to prevent the crystal defects with the guard ring line 13 as a starting point from extending to the first circuit region 2A and the second circuit region 2B which are element formation regions.

Figure 6:
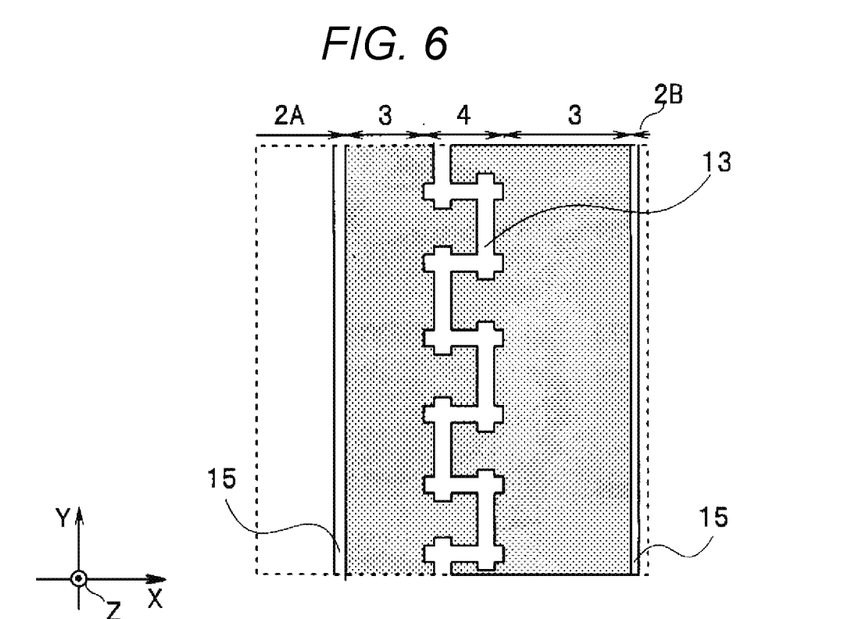
FIG. 6 is a plan view illustrating another layout of the guard ring line disposed in the guard ring region.

The shape of the guard ring line 13 may be a shape having a bent part or a branch line serving as a stress concentration point, and may be a shape other than the meander shape illustrated in FIG. 4. FIG. 6 is a plan view illustrating another layout of the guard ring line disposed in the guard ring region. For example, as illustrated in FIG. 6, the guard ring line 13 may have a shape of extending from the bent part in the X direction and the Y direction, respectively (a connection part between a portion extending in the X direction and a portion extending in the Y direction has a cross shape).

Figure 7:
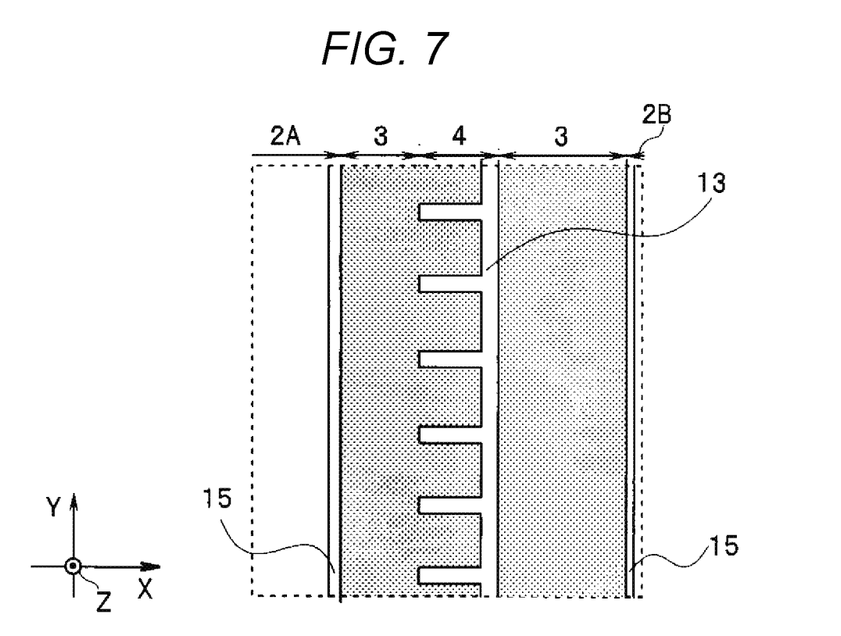
FIG. 7 is a plan view illustrating another layout of the guard ring line disposed in the guard ring region.

FIG. 7 is a plan view illustrating another layout of the guard ring line disposed in the guard ring region. For example, as illustrated in FIG. 7, the guard ring line 13 may have a comb shape in which a branch line extending in the X direction is provided in the middle of a straight line extending in the Y direction. In the layout illustrated in FIG. 7, it is assumed that the dislocation DL extends in a direction opposite to a direction in which the guard ring line 13 extends in the X direction, from a branch point on the straight line extending in the Y direction. In a case where the dislocation DL extends from the branch point toward the positive direction in the X direction, it is desirable that the guard ring line 13 extends in a direction opposite to a direction in which the extension of the dislocation DL is desired to be prevented.

Figure 8:
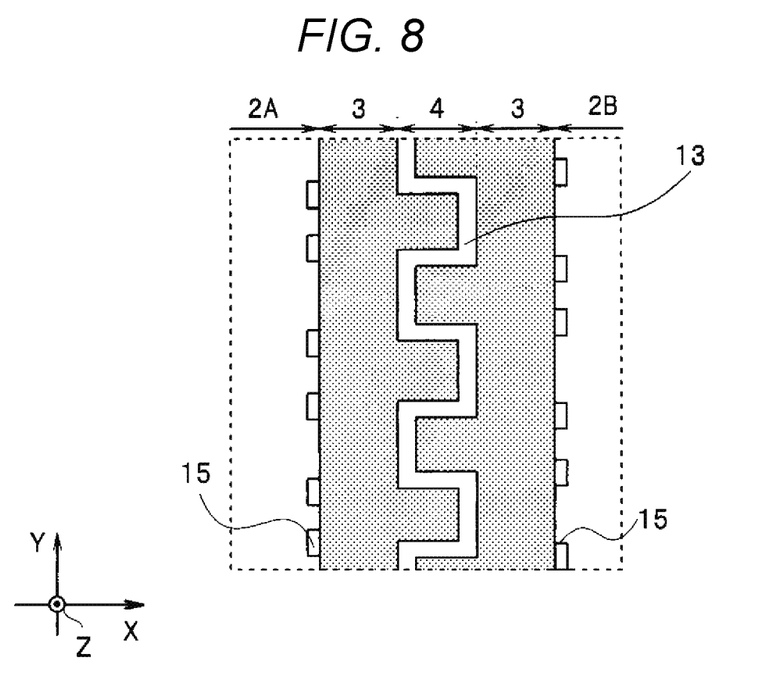
FIG. 8 is a plan view illustrating an example of a layout of a defect trapping region.

In the above description, the defect trapping region 15 is formed in a band shape along the boundary between the element isolation region 12 and the first circuit region 2A and the boundary between the element isolation region 12 and the second circuit region 2B, and the defect trapping region 15 may be formed in an island shape only in a region where the extension of the dislocation DL is expected and in a region where the extension of the dislocation DL is desired to be prevented. FIG. 8 is a plan view illustrating an example of the layout of the defect trapping region. For example, as illustrated in FIG. 8, at the boundary between the element isolation region 12 and the first circuit region 2A, the defect trapping region 15 may be formed in an island shape in a region near a location where a line extending in the X direction from a bent part toward the first circuit region 2A and a boundary between the element isolation region 12 and the first circuit region 2A intersect each other, and at the boundary between the element isolation region 12 and the second circuit region 2B, the defect trapping region 15 may be formed in an island shape in a region near a location where a line extending in the X direction from the bent part toward the second circuit region 2B and a boundary between the element isolation region 12 and the second circuit region 2B intersect each other.

The defect trapping region 15 may be formed in an island shape in a region near a location where a line extending in the X direction from the transistor 11 toward the guard ring region 4 and the boundary between the element isolation region 12 and the first circuit region 2A intersect each other, so that the dislocation DL does not extend near the transistor 11 formed in the first circuit region 2A.

In the above description, the guard ring region 4 between the first circuit region 2A and the second circuit region 2B and its peripheral structure are described, and the guard ring region 4 between the first circuit region 2A and the third circuit region 2C and its peripheral structure also have the same configuration.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device, comprising:
    a circuit region formed on a semiconductor substrate; and
    a guard ring region spaced from the circuit region,
    wherein the guard ring region includes:
    a guard ring line,
    wherein the guard ring line includes a plurality of guard ring patterns over a surface of the semiconductor substrate, each of the plurality of guard ring patterns include a first line segment extending in a first direction, a second line segment extending from a first end of the first line segment in a second direction orthogonal to the first direction, and a third line segment extending from a second end of the first line segment in the second direction,
    wherein in a first one and a second one of the plurality of guard ring patterns adjacent to each other, the second line segment of the first guard ring pattern is connected to the third line segment of the second guard ring pattern by a fourth line segment extending in the second direction;
    an element isolation region, formed of an insulating material between the circuit region and the guard ring region, that extends into the semiconductor substrate to a first depth;
    a first defect trapping layer, which is a highly distorted layer, formed below the element isolation region; and
    a second defect trapping layer, which is a highly distorted layer, formed along a boundary between the element isolation region and the circuit region, the second defect trapping layer extending into the semiconductor substrate to a second depth equal to the first depth, wherein
    the first and second defect trapping layers contain impurities implanted in a high concentration or include a first material different from a second material of the semiconductor substrate, and
    the first defect trapping layer extends from a first location between the circuit region and the element isolation region to a second location spaced from a boundary between the element isolation region and the guard ring region by an offset distance toward the circuit region in the second direction.

2. The semiconductor storage device according to claim 1, wherein
    the fourth line segment connects one end of the second line segment of the first guard ring pattern, which is not connected to the first line segment of the first guard ring pattern, to one end of the third line segment of the second guard ring pattern, which is not connected to the first line segment of the second guard ring pattern.

3. The semiconductor storage device according to claim 1, wherein
    the guard ring line has a meander-shaped planar shape.

4. The semiconductor storage device according to claim 1, wherein
    the first line segment extends in the first direction from a first connection part at an intersection of the first line segment and the second line segment, and the second line segment extends in the first and second directions from the first connection part,
    the first line segment extends in the first direction from a second connection part at an intersection of the first line segment and the third line segment, and the third line segment extends in the second direction from the second connection part,
    the fourth line segment extends in the first direction from a third connection part at an intersection of the fourth line segment and the second line segment, and the second line segment extends in the first and second directions from the third connection part, and
    the fourth line segment extends in the first direction from a fourth connection part at an intersection of the fourth line segment and the third line segment, and the third line segment extends in the second direction from the fourth connection part.

5. The semiconductor storage device according to claim 1, wherein
    the fourth line segment connects one end of the second line segment of the first guard ring pattern, which is connected to the first line segment of the first guard ring pattern, to one end of the third line segment of the second guard ring pattern, which is connected to the first line segment of the second guard ring pattern.

6. The semiconductor storage device according to claim 1, wherein
the guard ring line has a comb-shaped planar shape.

7. The semiconductor storage device according to claim 1, wherein
the offset distance is equal to or greater than a width of the first line segment extending in the second direction.

8. The semiconductor storage device according to claim 1, wherein
the impurities include at least one of carbon or oxygen.

9. The semiconductor storage device according to claim 1, wherein
the impurities include boron.

10. The semiconductor storage device according to claim 9, wherein
the second defect trapping layer is formed along the boundary location between the element isolation region and the circuit region, and the second defect trapping layer is formed at least near a third connection part at an intersection of the fourth line segment and the second line segment and a fourth connection part at an intersection of the fourth line segment and the third line segment.

11. The semiconductor storage device according to claim 1, wherein
the first material includes at least one of polycrystalline silicon, silicon oxide, or silicon nitride.

* * * * *